(12) United States Patent
Botula et al.

(10) Patent No.: US 8,299,561 B2
(45) Date of Patent: Oct. 30, 2012

(54) SHIELDING FOR HIGH-VOLTAGE SEMICONDUCTOR-ON-INSULATOR DEVICES

(75) Inventors: Alan B. Botula, Essex Junction, VT (US); Beth Ann Rainey, Williston, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 12/764,244

(22) Filed: Apr. 21, 2010

(65) Prior Publication Data

US 2011/0260281 A1 Oct. 27, 2011

(51) Int. Cl.
*H01L 21/70* (2006.01)
*H01L 23/53* (2006.01)
*H01L 27/12* (2006.01)

(52) U.S. Cl. . 257/499; 257/503; 257/347; 257/E27.112; 257/E23.141

(58) Field of Classification Search ............. 257/503, 257/506, E27.112, E23.141, 347, 336, E29.25, 257/499, 500, 337
See application file for complete search history.

(56) References Cited

U.S. PATENT DOCUMENTS

| 4,786,608 | A | 11/1988 | Griffith |
| 4,996,575 | A | 2/1991 | Ipri et al. |
| 6,121,661 | A * | 9/2000 | Assaderaghi et al. ........ 257/355 |
| 6,437,405 | B2 * | 8/2002 | Kim ............................. 257/347 |
| 7,195,961 | B2 | 3/2007 | Richter et al. |
| 2006/0068530 | A1 | 3/2006 | Schnitt et al. |
| 2007/0075317 | A1 | 4/2007 | Kato et al. |
| 2007/0075367 | A1 | 4/2007 | Boguszewics et al. |

OTHER PUBLICATIONS

Quirk, "Semiconductor manufacturing technology", 2001, pp. 35-36.*

* cited by examiner

*Primary Examiner* — A. Sefer
*Assistant Examiner* — Nikolay Yushin
(74) *Attorney, Agent, or Firm* — Richard M. Kotulak; Hoffman Warnick LLC

(57) ABSTRACT

Integrated circuits having doped bands in a substrate and beneath high-voltage semiconductor-on-insulator (SOI) devices are provided. In one embodiment, the invention provides an integrated circuit comprising: a semiconductor-on-insulator (SOI) wafer including: a substrate; a buried oxide (BOX) layer atop the substrate; and a semiconductor layer atop the BOX layer; a plurality of high voltage (HV) devices connected in series within the semiconductor layer; a doped band within the substrate and below a first of the plurality of HV devices; and a contact extending from the semiconductor layer and through the BOX layer to the doped band.

24 Claims, 6 Drawing Sheets

_US 8,299,561 B2_

SHIELDING FOR HIGH-VOLTAGE SEMICONDUCTOR-ON-INSULATOR DEVICES

BACKGROUND

One useful aspect of semiconductor-on-insulator (SOI) structures is that they permit the use of high-voltage SOI devices, such as diodes, field effect transistors (FETs), thyristors, and bipolar transistors. Still higher voltages may be achieved by connecting a plurality of such devices in series. However, doing so increases the difference in voltage potential between the device and an underlying substrate. This difference increases in each downstream device in the series. As such, the type and number of high-voltage SOI devices that may be connected in series is ultimately limited by the difference in voltage potential between the terminal device and its underlying substrate. Too great a difference in voltage potential will result in degradation of the breakdown voltage ($V_{br}$) of the series device, making the device "leaky." This can adversely impact the efficiency of the series device, sometimes to a degree that the series device fails. For example, in the case of five high-voltage (i.e., 30 V) diodes connected in series, the voltage at the terminal diode would theoretically be 150 V. However, at or near the terminal diode, this may result in too great a difference in voltage potential with the substrate, resulting in the voltage at the terminal diode being less than 150 V.

FIG. 1 shows an integrated circuit 100 including a substrate 10, a buried oxide (BOX) layer 20, and a semiconductor layer 30. Within semiconductor layer 30 are a plurality of HV SOI devices, here shown as diodes 40A-40D, connected in series. Diode 40A comprises a p-doped portion 42A and n-doped portion 44A. For the sake of clarity, the p-doped portions and n-doped portions of diodes 40B-D are not labeled, but are similar to p-doped portion 42A and n-doped portion 44A of diode 40A.

As can be seen in FIG. 1, a difference in voltage potential 41A between diode 40A and substrate 10 is less than a difference in voltage potential 41B between diode 40B and substrate 10. A difference in voltage potential 41C between diode 40C and substrate 10 is greater than difference in voltage potential 41B, and a difference in voltage potential 41D between diode 40D (the terminal diode) and substrate 10 is greater still. As noted above, difference in voltage potential 41D may be so great that the breakdown voltage degrades, resulting in voltage leakage.

SUMMARY

Integrated circuits having doped bands in a substrate and beneath high-voltage semiconductor-on-insulator (SOI) devices are provided.

A first aspect of the invention provides an integrated circuit comprising: a semiconductor-on-insulator (SOI) wafer including: a substrate; a buried oxide (BOX) layer atop the substrate; and a semiconductor layer atop the BOX layer; a plurality of high voltage (HV) devices connected in series within the semiconductor layer; a doped band within the substrate and below a first of the plurality of HV devices; and a contact extending from the semiconductor layer and through the BOX layer to the doped band.

A second aspect of the invention provides an integrated circuit comprising: a semiconductor-on-insulator (SOI) wafer including: a substrate; a buried oxide (BOX) layer atop the substrate; and a semiconductor layer atop the BOX layer; at least one high voltage (HV) device within the semiconductor layer; an n-doped band within the substrate and below the at least one HV device; and a contact extending from the semiconductor layer and through the BOX layer to the n-doped band.

A third aspect of the invention provides an integrated circuit comprising: a semiconductor-on-insulator (SOI) wafer including: a p-type substrate; a buried oxide (BOX) layer atop the substrate; and a semiconductor layer atop the BOX layer; a first high voltage (HV) device and a second HV device connected in series within the semiconductor layer; a first n-doped band within the substrate and below the first HV device; a second n-doped band within the substrate and below the second HV device; a first contact extending from the semiconductor layer and through the BOX layer to the first n-doped band; and a second contact extending from the semiconductor layer and through the BOX layer to the second n-doped band, wherein the first n-doped band and the second n-doped band are separated within the p-type substrate by a space, a portion of the first n-doped band extends laterally beyond an end of the first HV device, and a portion of the second n-doped band extends laterally beyond an end of the second HV device.

A fourth aspect of the invention provides a semiconductor-on-insulator (SOI) wafer including: a substrate; a buried oxide (BOX) layer atop the substrate; a semiconductor layer atop the BOX layer; a first doped band within the substrate; a second doped band within the substrate; a first contact extending from the semiconductor layer and through the BOX layer to the first doped band; and a second contact extending from the semiconductor layer and through the BOX layer to the second doped band.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
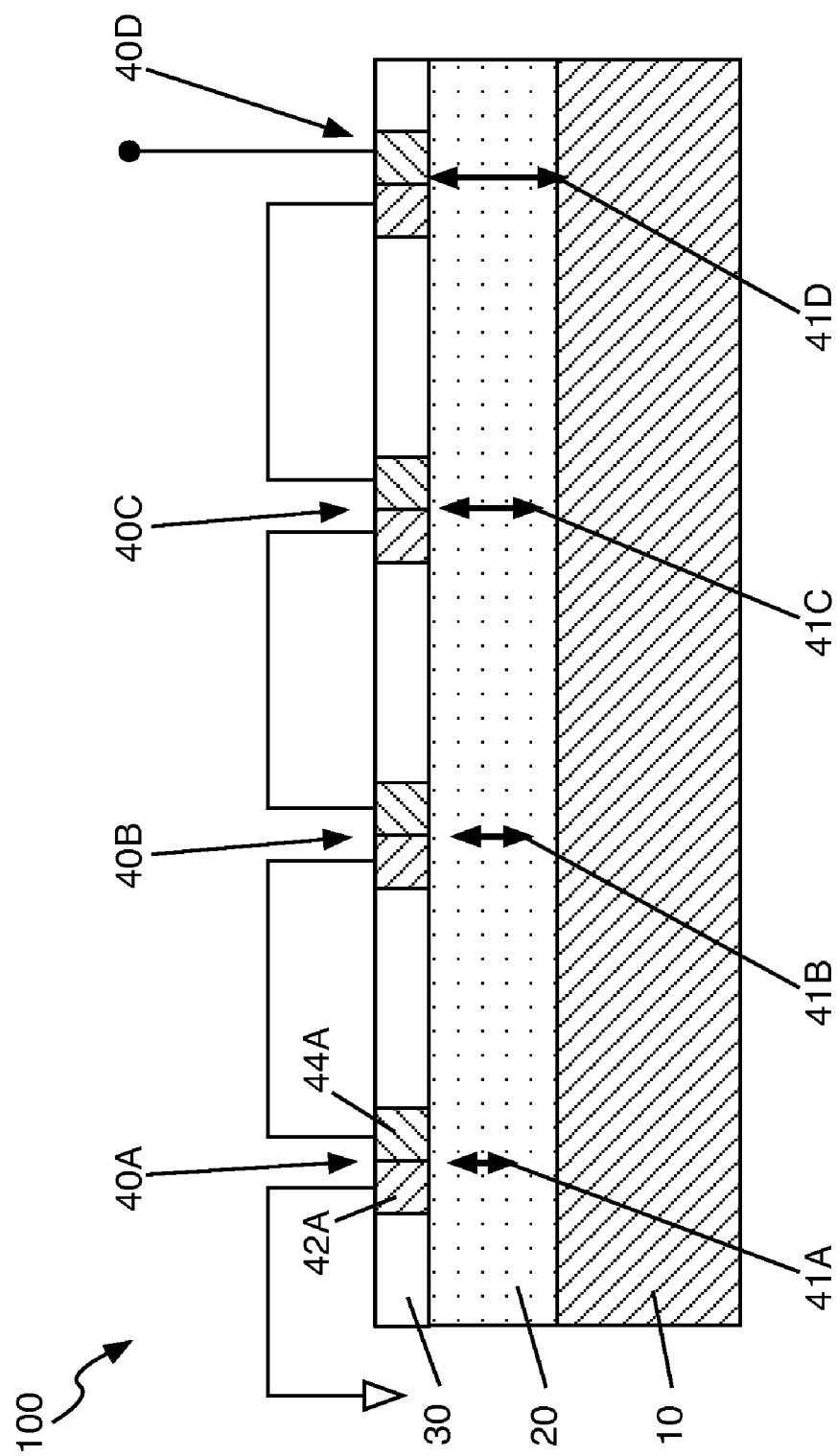
FIG. 1 shows a schematic cross-sectional view of an integrated circuit having a plurality of semiconductor-on-insulator (SOI) devices connected in series.
Figure 2:
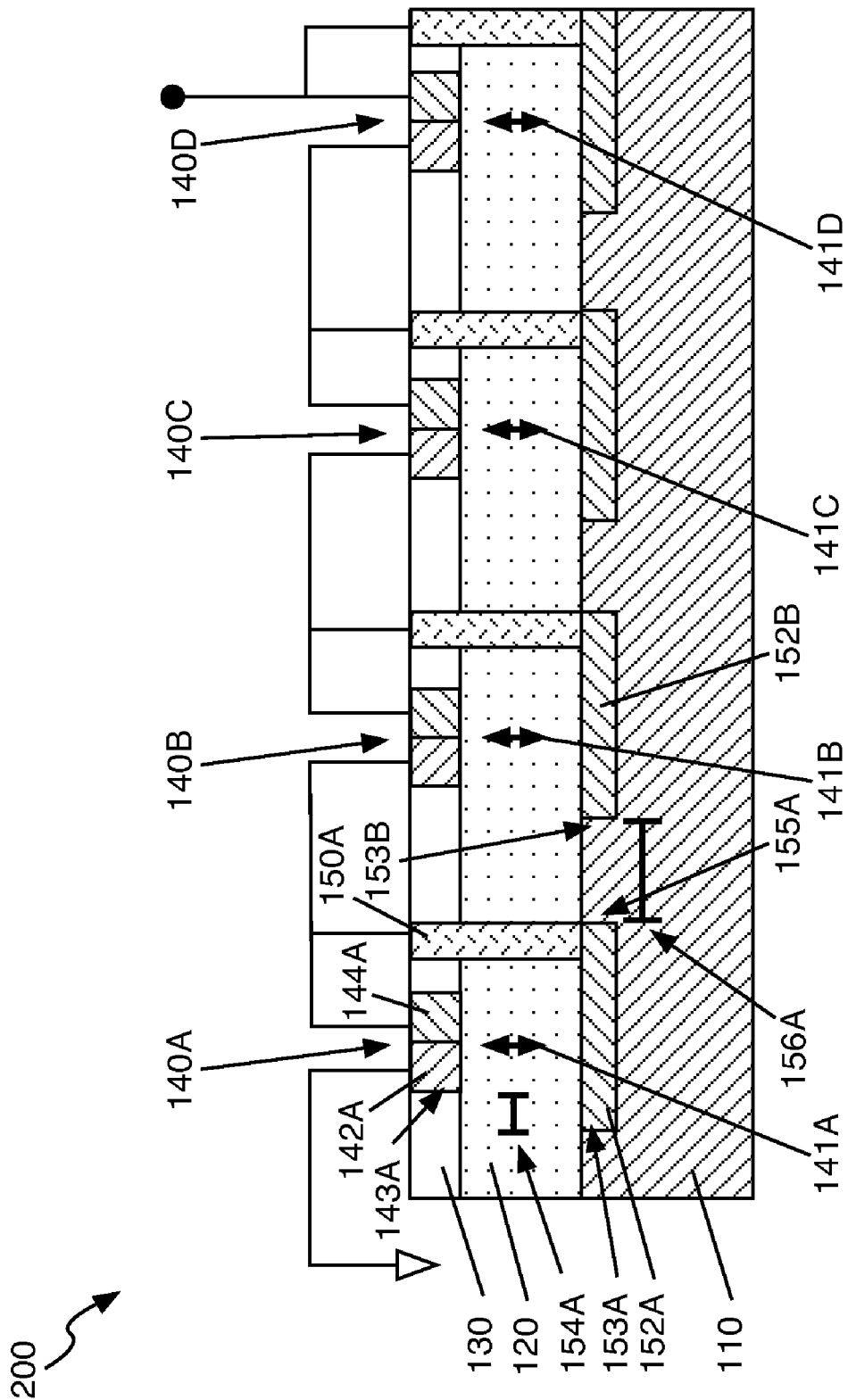
FIG. 2 shows a schematic cross-sectional view of an integrated circuit according to an embodiment of the invention.

FIG. 2 shows an integrated circuit 200 according to an embodiment of the invention. As in FIG. 1, wafer 200 includes a substrate 110, BOX layer 120, semiconductor layer 130, and a plurality of diodes 140A-140D within semiconductor layer 130. While shown herein as diodes, it should be understood that embodiments of the invention may employ one or more other devices, including but not limited to a field effect transistor (FET), a thyristor, and a bipolar transistor. Wafer 200 also includes a contact 150A disposed adjacent diode 140A and extending from semiconductor layer 130, through BOX layer 120, and contacting an n-doped band 152A within substrate 110. Again, for the sake of clarity, only the n-doped bands and contacts of diodes 140B-140D necessary for illustration of the depicted embodiment of the invention are labeled in FIG. 2.

Substrate 110 and/or semiconductor layer 130 may include silicon (p-doped, n-doped, and/or undoped), high-resistivity silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In some embodiments, the substrate 10 may include amorphous or polycrystalline silicon.

BOX layer 120 may include, for example, oxide, silicon oxide, silicon dioxide, silicon oxynitride, silicon nitride ($Si_3N_4$), tantalum oxides, alumina, hafnium oxide ($HfO_2$), hafnium silicate (HfSi), plasma-enhanced chemical vapor deposition oxide, tetraethylorthosilicate (TEOS), nitrogen oxides, nitrided oxides, aluminum oxides, zirconium oxide ($ZrO_2$), zirconium silicate ($ZrSiO_x$), high K (K>5) materials, and/or combinations thereof.

Contact 150A may include any conductive material, including, but not limited to, polysilicon, tungsten, silicon, and/or combinations thereof. Other useful materials include, for example, aluminum, an aluminum-copper alloy, cobalt, cobalt silicide, copper, metal silicide, nickel, nickel silicide, a nitrided metal, palladium, platinum, a refractory metal, such as ruthenium, tantalum nitride, titanium, titanium aluminum nitride, titanium nitride, titanium silicide, a titanium-tungsten alloy, and/or combinations thereof.

Dopants useful in forming, for example, n-doped band 152A include, but are not limited to, phosphorus, arsenic, antimony, sulphur, selenium, tin, silicon, and carbon. P-type dopants include, for example, but are not limited to: boron, indium, and gallium.

N-doped band 152A shields diode 140A, such that a difference in voltage potential 141A between diode 140A and substrate 110 is minimized. Thus, as can be seen in FIG. 2, difference in voltage potential 141A is substantially the same as the differences in voltage potentials 141B, 141C, and 141D between substrate 110 and diodes 140B, 140C, and 140D, respectively. That is, in wafer 200, differences in voltage potential do not increase along series-connected diodes as one approaches the terminal diode as they do in wafer 100 of FIG. 1. As such, embodiments of the invention permit the use of higher voltage devices and/or a larger number of devices connected in series, and therefore a higher total voltage, without degrading the breakdown voltage of the series-connected device or the loss of voltage through leakage.

The voltages of individual devices (e.g., diodes 140A-D) as well as the total voltage of the series-connected devices will depend, for example, on their application and the number of devices so connected. In some embodiments, voltages of individual devices are between about 10 V and about 50 V and total voltages are between about 20 V and about 150 V. Such voltages are exemplary, however, and are not limiting of the scope of the various embodiments of the invention.

In some embodiments of the invention, an end 153A of n-doped band 152A extends laterally beyond an end 143A of diode 140A, providing an overlap portion 154A. Such an arrangement helps control an electric field induced by diode 140 and ensures that substrate 110 does not act to gate diode 140A.

Similarly, in some embodiments of the invention, a space 156A remains between adjacent n-doped bands 152A, 152B. That is, a second end 155A of n-doped band 152A is separated within substrate 110 from a first end 153B of n-doped band 152B. Space 156A is large enough to ensure that n-doped band 152A and n-doped band 152B do not act as a single shield, which would cause the depletion regions of each diode 140A, 140B to intersect, resulting in a single voltage potential for the two diodes 140A, 140B.

Figure 3:
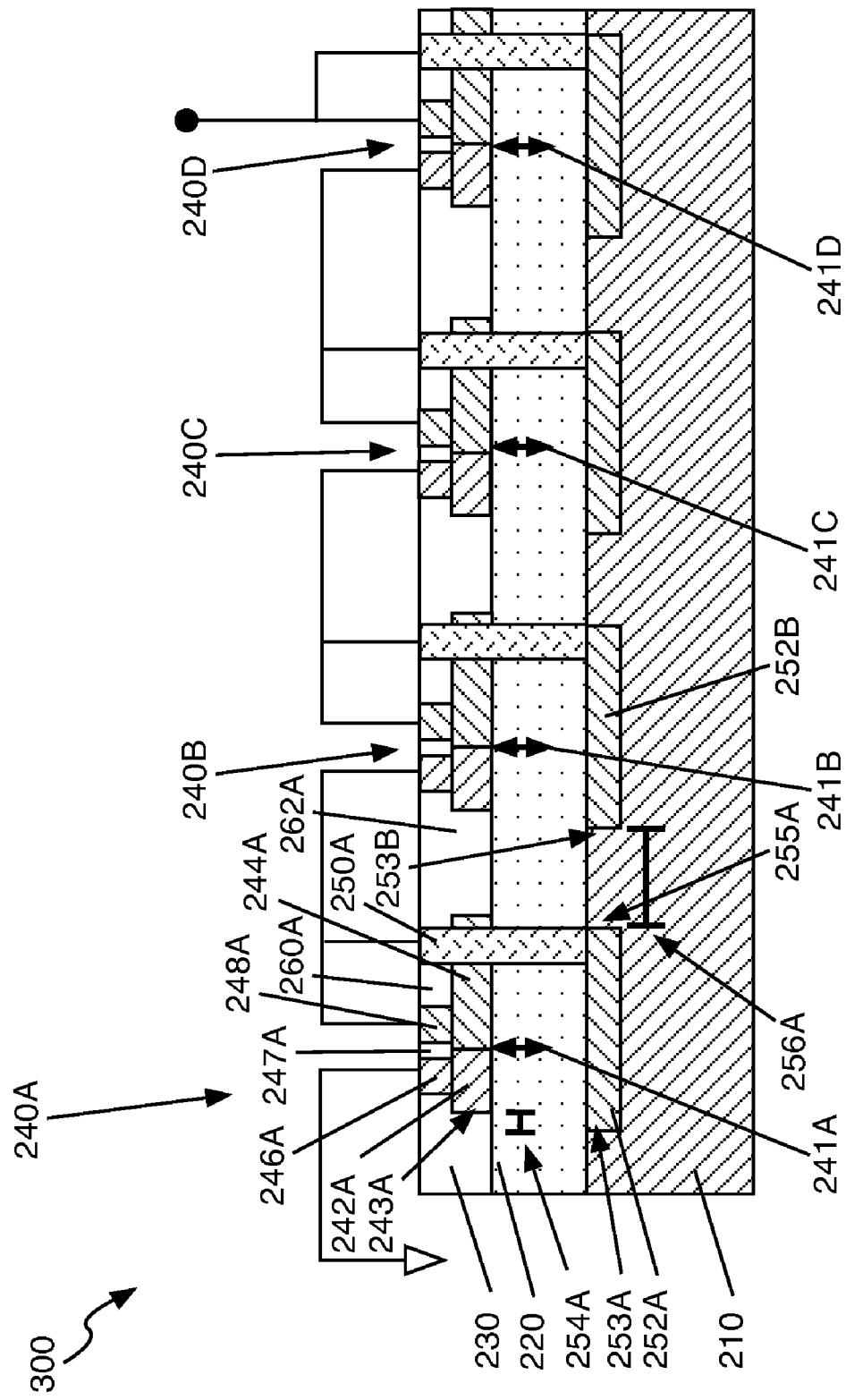
FIG. 3 shows a schematic cross-sectional view of an integrated circuit according to an other embodiment of the invention.

FIG. 3 shows an integrated circuit 300 according to another embodiment of the invention. Here, a plurality of deep diodes 240A-240D are connected in series within a thick semiconductor layer 230. Each deep diode (e.g., 240A) includes stacked p-doped regions 242A, 246A and stacked n-doped regions 244A, 248A, such that a shallow trench isolation 260A and deep trench isolation 262A are formed in semiconductor layer 230 adjacent each deep diode. Thick semiconductor layer 230 permits the incorporation of an internal isolation 247A within deep diode 240A. That is, internal isolation 247A isolates p-doped region 246A from n-doped region 248A but does not extend through to BOX layer 220.

Figure 4:
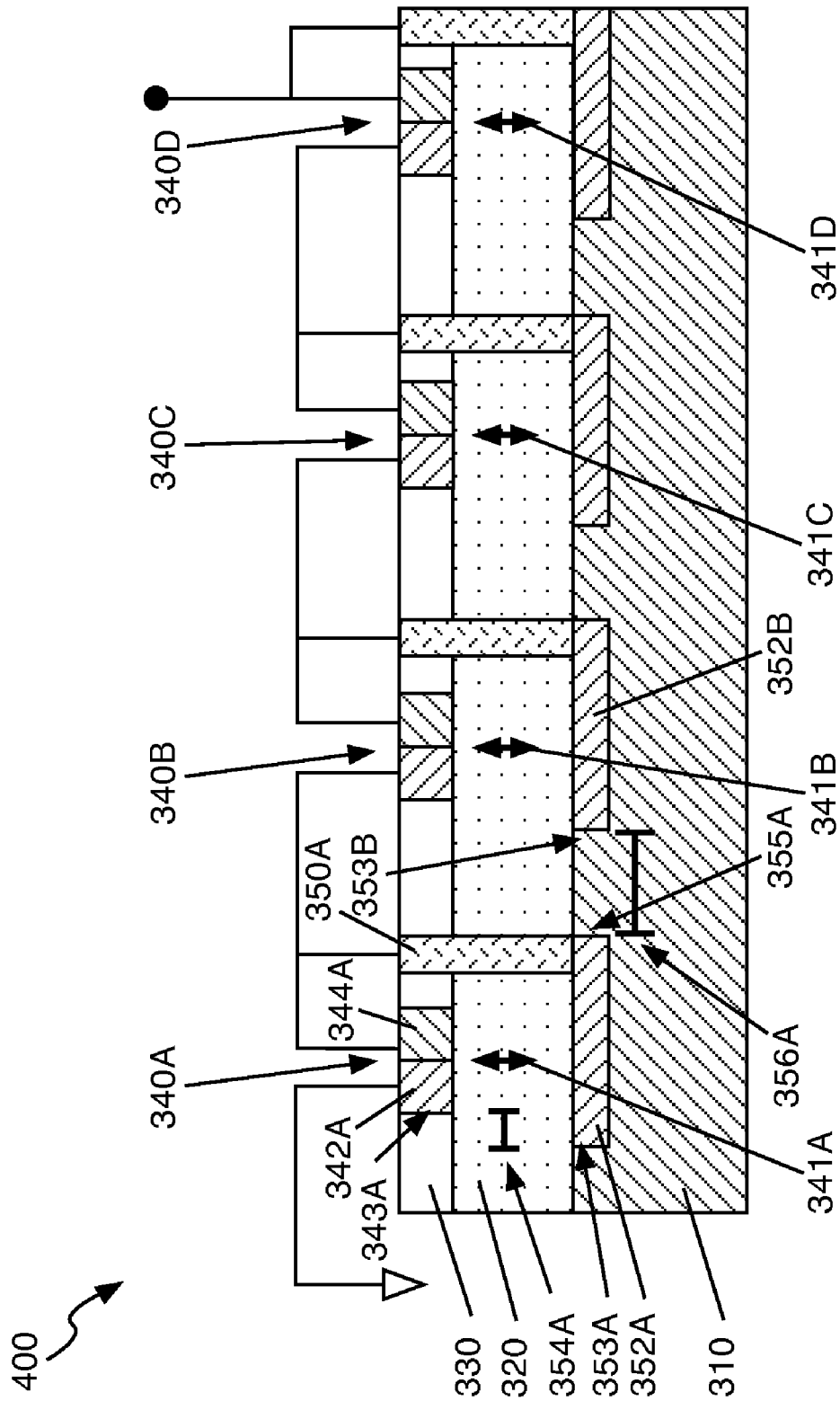
FIG. 4 shows a schematic cross-sectional view of an integrated circuit according to yet another embodiment of the invention.

FIG. 4 shows an integrated circuit 400 according to another embodiment of the invention, in which a p-doped band 352A is used in an n-type substrate. The shielding properties of wafer 400 are similar, therefore, to those of wafer 200 in FIG. 2.

Figure 5:
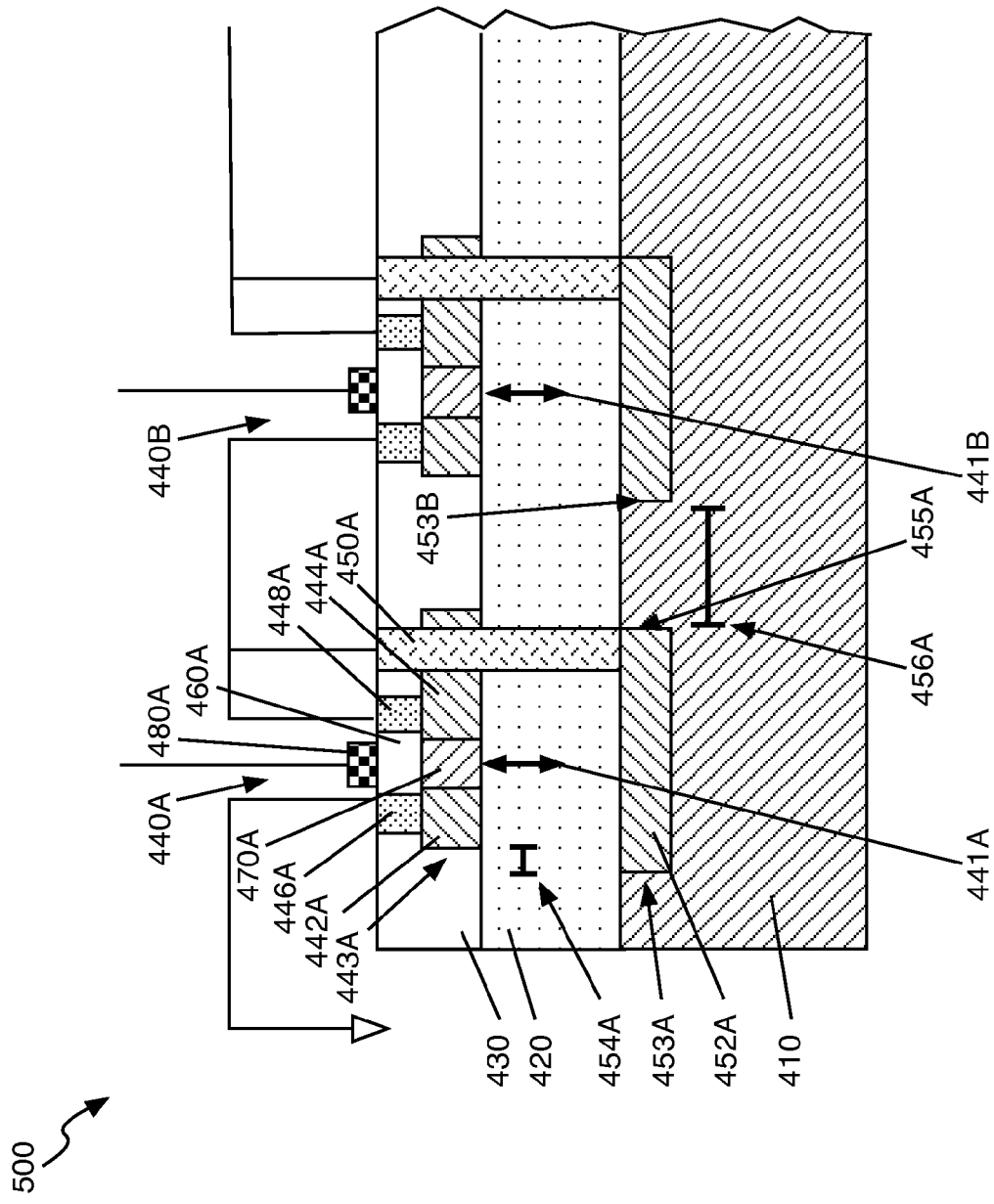
FIG. 5 shows a partial schematic cross-sectional view of an integrated circuit according to still another embodiment of the invention.

FIG. 5 shows an integrated circuit 500 according to yet another embodiment of the invention. In wafer 500, a plurality of high-voltage n-type field effect transistors (n-FETs) are connected in series. (For the sake of clarity, FIG. 5 shows only two n-FETs 440A, 440B, although any number of such devices may be connected in series, and only the features of n-FET 440A are labeled.) Each n-FET 440A, 440B includes a polysilicon gate 480A, polysilicon conductors 446A, 448A, a p-well 470A, n-wells 442A, 444A, and a gate oxide formed from shallow trench isolation (STI) 460A. In wafer 500, n-doped band 452A shields n-FET 440A similarly to the shielding of diode 140A in FIG. 2.

Figure 6:
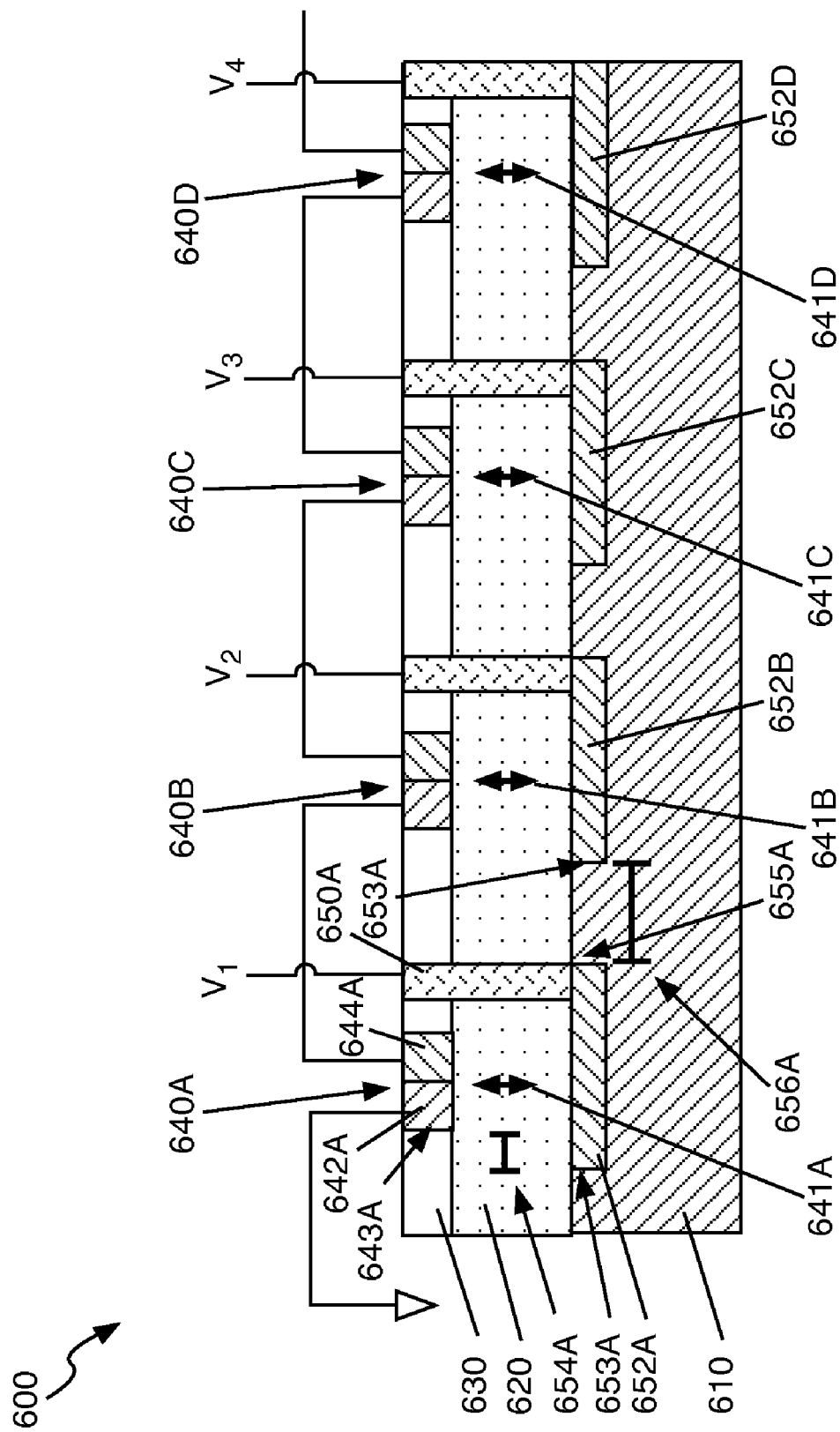
FIG. 6 shows a schematic cross-sectional view of an integrated circuit according to yet another embodiment of the invention.

FIG. 6 shows an integrated circuit 600 according to still another embodiment of the invention. Wafer 600 is similar to wafer 200 of FIG. 2, but each n-doped band 652A, 652B, 652C, 652D is biased to a voltage $V_1$, $V_2$, $V_3$, $V_4$, respectively. Each voltage $V_1$, $V_2$, $V_3$, $V_4$ is optimized to reduce voltage leakage or increase breakdown voltage ($V_{br}$) of its respective diode 640A, 640B, 640C, 640D.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An integrated circuit comprising:
a semiconductor-on-insulator (SOI) wafer including:
a p-type substrate;
a buried oxide (BOX) layer atop the p-type substrate; and
a semiconductor layer atop the BOX layer;
a plurality of high voltage (HV) devices connected in series within the semiconductor layer;
an n-doped band within the p-type substrate and below a first of the plurality of HV devices;
an additional n-doped band within the p-type substrate and below a second of the plurality of HV devices;
a contact extending from the semiconductor layer and through the BOX layer to the n-doped band; and
an additional contact extending through the BOX layer to the additional n-doped band between and connected in series to the second and a third of the plurality of HV devices.

2. The integrated circuit of claim 1, wherein each of the plurality of HV devices is independently selected from a group consisting of: a diode, a field effect transistor (FET), a thyristor, and a bipolar transistor.

3. The integrated circuit of claim 1, wherein the contact includes at least one conductive material selected from a group consisting of: polysilicon, tungsten, and silicon.

4. The integrated circuit of claim 1, wherein a difference in voltage potential between the substrate and at least one of the plurality of HV devices is between about 20 V and about 150 V.

5. The integrated circuit of claim 1, wherein the n-doped band includes at least one dopant selected from a group consisting of: phosphorus, arsenic, and antimony.

6. The integrated circuit of claim 1, wherein the n-doped band and the additional n-doped band are separated within the substrate by a space filled with a material of the p-type substrate.

7. The integrated circuit of claim 1, wherein the contact is connected in series between the first and a second of the plurality of HV devices.

8. The integrated circuit of claim 1, wherein a portion of the doped band extends laterally beyond an end of the first of the plurality of HV devices.

9. The integrated circuit of claim 1, wherein the substrate is selected from a group consisting of: p-doped silicon, high-resistivity silicon, and n-doped silicon.

10. The integrated circuit of claim 1, wherein the semiconductor layer includes at least one material selected from a group consisting of: p-doped silicon, high-resistivity silicon, and n-doped silicon.

11. The integrated circuit of claim 1, wherein the doped band is biased to a voltage.

12. The integrated circuit of claim 1, wherein the doped band is connected in series to the first of the plurality of HV devices and a second of the plurality of HV devices.

13. The integrated circuit of claim 1, wherein at least one of the plurality of HV devices includes an internal isolation that does not reach the BOX layer.

14. An integrated circuit comprising:
a semiconductor-on-insulator (SOI) wafer including:
a substrate;
a buried oxide (BOX) layer atop the substrate; and
a semiconductor layer atop the BOX layer;
at least one high voltage (HV) device within the semiconductor layer;
an n-doped band within the substrate and below the at least one HV device; and
a contact extending from the semiconductor layer and through the BOX layer to the n-doped band,
wherein a portion of the n-doped band extends laterally beyond an end of the at least one HV device.

15. The integrated circuit of claim 14, wherein the at least one HV device includes a plurality of HV devices and each of the plurality of HV devices is independently selected from a group consisting of: a diode, a field effect transistor (FET), a thyristor, and a bipolar transistor.

16. The integrated circuit of claim 14, wherein the contact includes at least one conductive material selected from a group consisting of: polysilicon, tungsten, silicon, aluminum, an aluminum-copper alloy, cobalt, cobalt silicide, copper, metal silicide, nickel, nickel silicide, a nitrided metal, palladium, platinum, a refractory metal such as ruthenium, tantalum nitride, titanium, titanium aluminum nitride, titanium nitride, titanium silicide, a titanium-tungsten alloy, and combinations thereof.

17. The integrated circuit of claim 14, wherein the n-doped band is operable to be biased to a voltage.

18. An integrated circuit comprising:
a semiconductor-on-insulator (SOI) wafer including:
a p-type substrate;
a buried oxide (BOX) layer atop the substrate; and
a semiconductor layer atop the BOX layer;
a first high voltage (HV) device and a second HV device connected in series within the semiconductor layer;
a first n-doped band within the substrate and below the first HV device;
a second n-doped band within the substrate and below the second HV device;
a first contact extending from the semiconductor layer and through the BOX layer to the first n-doped band; and
a second contact extending from the semiconductor layer and through the BOX layer to the second n-doped band,
wherein the first n-doped band and the second n-doped band are separated within the p-type substrate by a space, a portion of the first n-doped band extends laterally beyond an end of the first HV device, and a portion of the second n-doped band extends laterally beyond an end of the second HV device.

19. The integrated circuit of claim 18, wherein each of the first HV device and the second HV device is independently selected from a group consisting of: a diode, a field effect transistor (FET), a thyristor, and a bipolar transistor.

20. The integrated circuit of claim 18, wherein:
the p-type substrate includes at least one dopant selected from a group consisting of: boron, indium, and gallium;
the n-doped band includes at least one dopant selected from a group consisting of: phosphorus, arsenic, antimony, sulphur, selenium, tin, silicon, and carbon;
each of the first contact and the second contact is independently selected from a group consisting of: polysilicon, tungsten, silicon, aluminum, an aluminum-copper alloy, cobalt, cobalt silicide, copper, metal silicide, nickel, nickel silicide, a nitrided metal, palladium, platinum, a refractory metal such as ruthenium, tantalum nitride, titanium, titanium aluminum nitride, titanium nitride, titanium silicide, a titanium-tungsten alloy, and combinations thereof; and
the BOX layer includes at least one material selected from a group consisting of: oxide, silicon oxide, silicon dioxide, silicon oxynitride, silicon nitride ($Si_3N_4$), tantalum oxides, alumina, hafnium oxide ($HfO_2$), hafnium silicate (HfSi), plasma-enhanced chemical vapor deposition oxide, tetraethylorthosilicate (TEOS), nitrogen oxides, nitrided oxides, aluminum oxides, zirconium oxide (ZrO$_2$), zirconium silicate (ZrSiO$_x$), high K (K>5) materials, and combinations thereof.

21. An integrated circuit comprising:
a semiconductor-on-insulator (SOI) wafer including:
  a substrate;
  a buried oxide (BOX) layer atop the substrate; and
  a semiconductor layer atop the BOX layer;
a plurality of high voltage (HV) devices connected in series within the semiconductor layer;
a doped band within the substrate and below a first of the plurality of HV devices; and
a contact extending from the semiconductor layer and through the BOX layer to the doped band,
wherein the contact is connected in series between the first and a second of the plurality of HV devices.

22. An integrated circuit comprising:
a semiconductor-on-insulator (SOI) wafer including:
  a substrate;
  a buried oxide (BOX) layer atop the substrate; and
  a semiconductor layer atop the BOX layer;
a plurality of high voltage (HV) devices connected in series within the semiconductor layer;
a doped band within the substrate and below a first of the plurality of HV devices; and
a contact extending from the semiconductor layer and through the BOX layer to the doped band,
wherein a portion of the doped band extends laterally beyond an end of the first of the plurality of HV devices.

23. An integrated circuit comprising:
a semiconductor-on-insulator (SOI) wafer including:
  a substrate;
  a buried oxide (BOX) layer atop the substrate; and
  a semiconductor layer atop the BOX layer;
a plurality of high voltage (HV) devices connected in series within the semiconductor layer;
a doped band within the substrate and below a first of the plurality of HV devices; and
a contact extending from the semiconductor layer and through the BOX layer to the doped band,
wherein the doped band is connected in series to the first of the plurality of HV devices and a second of the plurality of HV devices.

24. An integrated circuit comprising:
a semiconductor-on-insulator (SOI) wafer including:
  a substrate;
  a buried oxide (BOX) layer atop the substrate; and
  a semiconductor layer atop the BOX layer;
a plurality of high voltage (HV) devices connected in series within the semiconductor layer;
a doped band within the substrate and below a first of the plurality of HV devices; and
a contact extending from the semiconductor layer and through the BOX layer to the doped band,
wherein at least one of the plurality of HV devices includes an internal isolation that does not reach the BOX layer.

* * * * *